United States Patent [19]
Mohr

[11] Patent Number: 5,554,936
[45] Date of Patent: Sep. 10, 1996

[54] MIXED FLUID TIME DOMAIN REFLECTOMETRY SENSORS

[76] Inventor: Charles L. Mohr, 1440 Agnes St., Richland, Wash. 99352

[21] Appl. No.: 349,152

[22] Filed: Dec. 1, 1994

[51] Int. Cl.⁶ .................................................. G01R 27/04
[52] U.S. Cl. ......................... 324/642; 324/632; 324/643; 324/634; 324/446
[58] Field of Search .................................. 324/632, 642, 324/643, 634, 446

[56] References Cited

U.S. PATENT DOCUMENTS

| | | |
|---|---|---|
| 3,424,002 | 1/1969 | Johnson . |
| 3,474,337 | 10/1969 | Petrick . |
| 3,572,119 | 3/1971 | Bak . |
| 3,626,284 | 12/1971 | Bak . |
| 3,695,107 | 10/1972 | Hertz et al. . |
| 3,812,422 | 5/1974 | De Carolis . |
| 3,832,900 | 9/1974 | Ross . |
| 3,853,005 | 12/1974 | Schendel . |
| 3,922,914 | 12/1975 | Fuchs . |
| 3,995,212 | 11/1976 | Ross . |
| 4,135,397 | 1/1979 | Krake . |
| 4,170,135 | 10/1979 | Booman et al. . |
| 4,345,202 | 8/1982 | Nagy et al. . |
| 4,453,125 | 6/1984 | Kimura ................................... 324/632 |
| 4,495,807 | 1/1985 | Field et al. . |
| 4,510,437 | 4/1985 | Iskander . |
| 4,786,857 | 11/1988 | Mohr et al. . |
| 4,807,471 | 12/1989 | Cournane ................................ 324/643 |
| 4,922,180 | 5/1990 | Saffer ..................................... 324/639 |
| 5,376,888 | 12/1994 | Hook ...................................... 324/643 |

OTHER PUBLICATIONS

C. L. Mohr et al., Nuclear Regulatory Commission document entitled "Void Fraction Measurement Liquid Level Detection Concept Assessment and Development," CF-5059. Nov. 1987.

Primary Examiner—Kenneth A. Wieder
Assistant Examiner—Jose M. Solis
Attorney, Agent, or Firm—Wells, St. John, Roberts, Gregory & Matkin, P. S.

[57] ABSTRACT

A sensor for use with time domain reflectometry systems to allow measurement of relative proportions of intermixed constituents having differing electrical permittivities contained in a fluid mixture. The sensor comprises a central primary electrode and a pair of adjacent outer secondary outer electrodes. The fluid mixture is located between the electrodes during sensing. A dielectric layer covers exposed sensing surfaces of the electrodes to electrically isolate the electrodes from the fluid mixture and to prevent dissipation of a time domain reflectometry signal propagated through the sensor.

45 Claims, 7 Drawing Sheets

MIXED FLUID TIME DOMAIN REFLECTOMETRY SENSORS

TECHNICAL FIELD

The technical field of this invention is sensing apparatus used with time domain reflectory systems to determine the relative proportions of mixed fluids, particularly mixed liquid and gaseous phases, for example mixtures of water and steam.

BACKGROUND OF THE INVENTION

Time domain reflectometry has been previously known effective in methods for determining the level of a liquid, such as in a tank. In such time domain reflectometry methods, electrical pulses are conveyed along a transmission line to an electrically conductive probe extending over the range of liquid levels being detected. The stimulating electrical pulses produced in the time domain reflectometry system are partially reflected at the vapor-liquid interface due to a change in the electrical impedance. The impedance change is associated with the differences in the dielectric strength between the liquid and the overlying gas or vapor. The electrical permittivity is another term indicating the dielectric properties of the fluids involved.

U.S. Pat. No. 4,786,857 to Charles L. Mohr et al., entitled "Methods and Apparatus for Time Domain Reflectometry Determination of Relative Proportion, Fluid Inventory and Turbulence," disclosed apparatus and methods for using time domain reflectometry to determine the relative proportions of intermixed constituents in a fluid system. Such apparatus and methods can be used to determine the relative proportions of liquid and vapor even when the liquid and vapor are intermixed either homogeneously or non-homogeneously. Measurement capabilities such as these are particularly valuable to the process industries and nuclear energy production. The systems can be used to monitor nuclear reactor coolant systems, in which the total inventory of system coolant, including intermixed water and steam, must be determined under a variety of conditions, including even accident conditions. Methods are also described for obtaining indications of turbulence in fluid mixtures by measuring variations in fluid properties over time.

The Mohr patent mentioned above disclosed a probe including a inner centrally located electrode mounted within a cylindrical outer electrode. The cylindrical outer electrode was provided with slots to allow fluid to pass into the annular volume between the inner and outer electrodes. The probe was immersed in the mixed-constituent system. The average permittivity experienced by the electrical pulse transitting the probe was determined using time domain reflectometry. The measured permittivity was then correlated with known characteristic data of the constituents being measured to determine their relative proportions.

The probe shown in the Mohr patent was found ineffective when used in some applications. In particular, solutions rich in minerals such as from earth wells were not capable of measurement. Accordingly, there was a need for an improved probe which could be used for a greater variety of applications and still provide measurements. The current invention addresses this need for improved time domain reflectometry probes which are capable of service under a variety of conditions with accuracy and reliability.

BRIEF DESCRIPTION OF THE DRAWINGS

One or more preferred forms of the invention are described herein with reference to the accompanying drawings. The drawings are briefly described below.

DETAILED DESCRIPTION OF THE PREFERRED EMBODIMENTS

This disclosure of the invention is submitted in furtherance of the constitutional purposes of the U.S. Patent Laws "to promote the progress of science and useful arts." U.S. Constitution, Article 1, Section 8.

Figure 1:
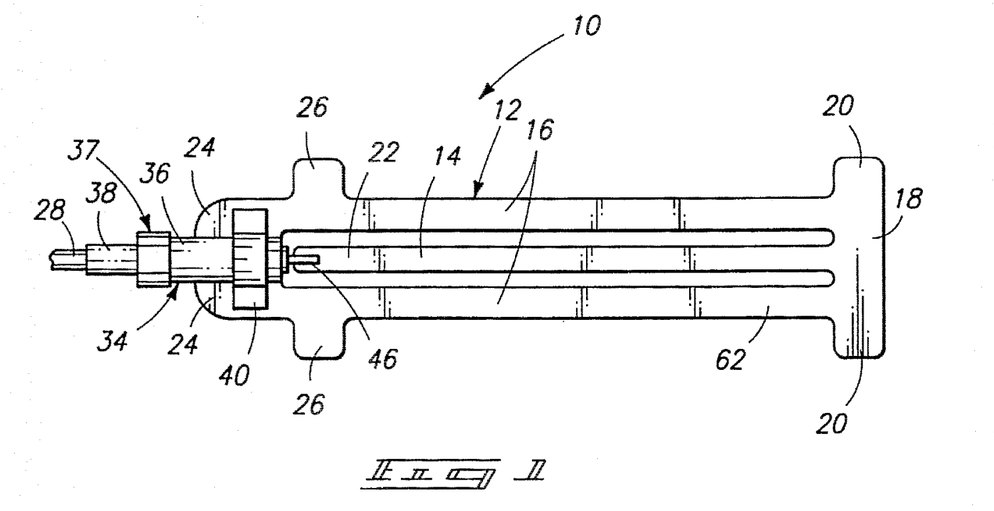
FIG. 1 is a front view of a time domain reflectometry sensor in accordance with a first preferred embodiment of the invention.
Figure 2:
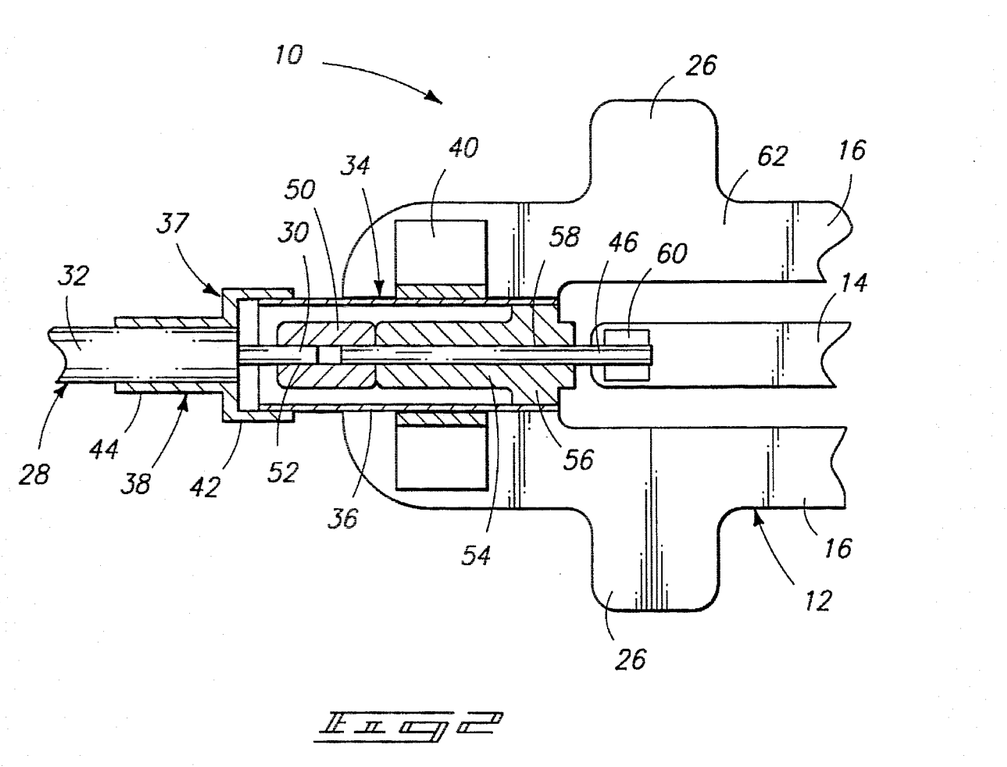
FIG. 2 is an enlarged partial front view, shown partially in sectional view of the sensor shown in FIG. 1.

FIGS. 1 and 2 show a time domain reflectometry sensor or probe 10 in accordance with a first preferred embodiment of the invention. The probe is intended to be used with time domain reflectometry systems to allow measurement of relative proportions of intermixed constituents having differing electrical permittivities contained in a fluid mixture. An example of such a time domain reflectometry system is described in U.S. Pat. No. 4,786,857 to Charles L. Mohr, entitled "Methods and Apparatus for Time Domain Reflectometry Determination of Relative Proportion, Fluid Inventory and Turbulence," which is hereby incorporated by reference. Such systems can also be used to provide a measure of turbulence.

Probe 10 advantageously includes a probe blade 12. Blade 12 is adapted for immersion in a fluid mixture of intermixed constituents having differing electrical permittivities. The intermixed constituents can be of the same phase, e.g. both liquid, or can be of mixed phases, e.g. liquid and gas. Blade 12 is preferably formed in the shape of an elongated flat blade, as shown, for direct immersion in a vessel or conduit which contains the fluid. The blade is advantageously supported at both ends and oriented with its flat surfaces parallel to the direction of fluid flow to create minimal hydrodynamic drag within the fluid flow.

Probe blade 12 includes at least a central primary electrode 14 and at least one outer or secondary electrode 16. Electrodes 16 are preferably formed alongside and parallel with central electrode 14 with the secondary electrodes along opposing sides of the central electrode in a spaced parallel relationship which provides an approximately planar or blade-shaped electrode array. As shown, the blade advantageously includes two outer secondary electrodes 16 which are spaced equally and symmetrically about opposite sides of central electrode 14 to allow communication of fluids therebetween. The electrodes are elongated and adapted for direct immersion in a fluid mixture.

Electrodes 14 and 16 have distal portions or ends which terminate in a distal connection 18. Distal connection 18 can advantageously be provided with distal mounting flags or tabs 20 which extend laterally outward beyond the width of the outer electrodes. Electrodes 14 and 16 extend from distal connection 18 to proximal ends 22 and 24, respectively. Proximal end mounting flags or tabs 26 are located at or near proximal ends 24 of outer electrodes 16, extending laterally outward therefrom. Tabs 20 and 26 can conveniently be utilized to support or mount probe 10 within a fluid conduit (not shown).

Probe blade 12 is preferably fabricated from a metal, alloy or other suitable electrically conductive material which is advantageously resistant to corrosion and erosion. A variety of materials are suitable. Hastelloy and Zircaloy are examples of suitable materials, with Zircaloy being preferred in high temperature, highly corrosive environments. Zircaloy is a trademark for a family of materials in further discussion herein a variety of Zircaloy alloys can be used depending upon the process conditions, Zircaloy 4 is most preferred for the mineralized water and steam application mentioned herein.

In operation, the probe is preferably connected to a coaxial electrical signal lead such as coaxial cable 28 shown. Coaxial cable 28 has a central or inner conductor 30 and an outer coaxial metal conductor or sheathing 32. Central conductor 30 is electrically connected to central electrode 14. Outer sheathing 32 is electrically connected to both of the outer secondary electrodes 16. Because probe 10 is contemplated for use in a high temperature environment, cable 28 has a stainless steel sheathing, silica insulation, and a copper central conductor. This design for lead 28 is sometimes referred to as "hardline" coaxial cable.

A time domain reflectometry signal having a very sharp rise and drop in voltage is transmitted through the central conductor and reflected at both the proximate and distal ends of the sensor. Reflections occur at both ends of the probe due to impedance changes. The short time period between the signal reaching the proximal end of the probe and the time it reaches the distal end is a function strongly affected by the average permittivity of the fluid mixture in which the sensor is immersed.

Sensor or probe 10 advantageously includes a transition assembly 34 which is connected to the electrodes at the proximate ends thereof. The transition assembly serves to connect coaxial cable 28 to the electrodes. It also advantageously is used to provide improved sealing to prevent fluid from leaking about the probe yet allow the signal lead to pass into a vessel or piping fixture. Transition assembly 34 receives an end of coaxial cable 28 to seal the end from the fluid mixture in which blade 12 is immersed.

Transition assembly 34 includes a housing 37 which is received over and connected to outer sheathing 32 of cable 28. The housing advantageously includes a tubular ferrule 36 and a mating cap 38. Ferrule 36 advantageously is mounted between the proximal ends of the pair of secondary electrodes 16, such as by welding or brazing the tubular ferrule directly to the inward surfaces of the secondary electrodes. A reinforcing bracket 40 is advantageously used to further connect the ferrule and both electrodes 16. The ferrule and transition assembly are preferably coaxially oriented with respect to the central primary electrode 14.

Ferrule 36 is preferably cylindrical and has a diameter larger than the outer diameter of coaxial cable 28. Mating cap 38 is also preferably cylindrical, having a probe end 42 with an internal diameter complementary to the external diameter of ferrule 36. Probe end 42 of mating cap 38 is brazed or welded over ferrule 36. Cap 38 also has a cable end 44 with an internal diameter complementary to the external diameter of cable outer sheathing 32. Cable end 44 of cap 38 is brazed or welded over outer sheathing 32.

Outer sheathing 32 and the underlying coaxial cable insulating material are trimmed from the probe end of cable 28 so that only the copper central conductor 30 of cable 28 extends within ferrule 36. A stainless steel or other suitable central conductor extension or conductor pin 46 extends substantially between and serves to electrically connect central cable conductor 30 and centrally positioned primary electrode 14. As shown, conductor pin 46 is assisted in its connection with central cable conductor 30 by means of a connector tube 50. Connector tube 50 is preferably formed of an electrically non-conducting ceramic such as alumina. The outer diameter of connector tube 50 is preferably smaller than the internal diameter of ferrule 36. A conductor aperture 52 is formed through connector tube 50 to receive both central cable conductor 30 and conductor pin 46. Cable conductor 30 and conductor pin 46 are suitably connected, such as by vacuum brazing a conductive filler material within conductor aperture 52 to form an electrical and physical connection between the extension 46 and conductor 30.

Transition assembly 34 further includes an inward seal piece 54 which is received within ferrule 36. Inward seal piece 54 has a diameter which is smaller than the internal diameter of ferrule 36, except for a sealing portion 56 having an enlarged diameter which is complementary to the internal diameter of ferrule 36. Inward seal piece 54 is preferably fabricated from a ceramic material which is capable of being connected to ferrule 36 to form a durable sealed connection yet provide electrical isolation to the central conductor 46. An alumina ceramic is a preferred material which can also be brazed to form the desired connection with tubular ferrule 36 and extension 46. It can be brazed to stainless steel ferrule 36 by first metalizing the surface of the sealing portion 56 and then brazing with a copper-gold brazing alloy. The extension conductor 46 is also suitably connected to inward seal piece 54 prevent fluid leakage about the extension conductor within the conductor passage 58 through which it extends.

Other materials combinations are also possible for differing service environments. For example, alumina has been found to corrode in high pH solutions. Accordingly, a more chemically resistant ceramic such as zirconium oxide, stabilized with magnesia, is used in high-pH environments. The zirconium oxide insulator is brazed to ferrule 36 about the periphery of sealing portion 56 with a copper-gold brazing alloy as described above.

Probe blade 12, including electrodes 14 and 16, is preferably integrally formed of materials such as described above. If a Zircaloy blade is used with a stainless steel conductor pin 46, they are bonded by first vacuum brazing conductor pin 46 to a contact piece 60. Contact piece 60 is preferably made of stainless steel with Zircaloy explosively bonded thereto to allow a reliable connection to be formed between the Zircaloy electrode and the Zircaloy layer of the contact piece 60. A similar sandwich construction is also preferably used for part 40 when the blade is made of Zircaloy and the ferrule is made of stainless steel.

The electrodes of blade 12 form sensing surfaces which are defined by their exposure to a fluid mixture when sensing. Specifically, central electrode 14 and outer electrodes 16 have sensing surfaces adjacent to the fluid mixture. Furthermore, a dielectric layer 62 covers at least the sensing surfaces of central electrode 14. Such a dielectric layer 62 advantageously also preferably covers portions of outer electrodes 16. More preferably, dielectric layer 62 covers all portions of blade 12 which are immersed in the fluid mixture, including central electrode 14 and outer electrodes 16. In the preferred embodiment, dielectric layer 62 covers the entire blade 12 and transition 34. Dielectric layer 62 electrically insulates and isolates central primary electrode 14 and outer secondary electrodes 16 from the fluid mixture and helps prevent dissipation or attenuation of the stimulating time domain reflectometry signal and the resulting reflected signals.

Teflon polymer (polytetrafluoroethylene) is one preferred material for forming dielectric layer 62. Teflon is preferably applied to the probe blade by using a baked Teflon coating process, such as at a temperature of 750 degrees Fahrenheit. The process results in a Teflon layer having a thickness of between 0.002 and 0.005 inches, preferably about 0.003 inches. The Teflon is applied after the coaxial cable and transition assembly are attached so that it covers all exposed conductive elements.

Oxidation is another method of providing a dielectric layer over portions of probe blade 12. Preferred methods of oxidizing a Zircaloy blade include subjecting it to steam in an autoclave at 400 degrees Celsius at a pressure of 1500 pounds per square inch for approximately 48 hours. This process creates a zirconium oxide surface which is electrically non-conductive while also being highly resistant to corrosion.

Oxides can alternatively be sputtered onto the surface of the probe blade. The resulting oxide coating is optionally hardened by subsequently treating the probe blade in a vacuum furnace at 750 degrees Celsius for two hours. The oxides will typically have thickness of 0.001–0.010 inch.

An alternative oxidation method involves anodizing the blade before the coaxial cable and transition assembly are attached. The resulting anodized surface provides dielectric isolation between the probe blade elements and the fluid mixture. Anodization of a Zircaloy blade is preferably accomplished in 0.05% sodium hydroxide at 150 volts for 30 minutes. The anodized surface is removed over blade areas to which components are to be welded.

The coatings or layers described above can be combined. For instance, one preferable dielectric layer is obtained by providing a Teflon coating over an anodized surface.

Tests indicate that a baked Teflon coating works well in applications where erosion of the blade surface is not a problem and where fluid mixture temperatures are less than 550 degrees Fahrenheit. The blade of such a probe can be made of various nickel-based alloys to resist corrosion. While a Teflon coating has very slight effect on probe impedance measurements, such an effect is constant and can be easily accounted for during calibration of the system. More importantly, the insulating properties of the Teflon or other dielectric layer or layers significantly reduce signal losses through attenuation where measurements are being taken in conductive fluid mixtures.

In applications where erosion is a problem or where temperatures are greater than 550 degrees Fahrenheit, an oxide coating is preferable to Teflon. Such an oxide coating may be created by anodizing or autoclaving as mentioned above. Oxide layers have a similar effect on impedance measurements as does a Teflon coating.

FIGS. 3–8 show an alternative time domain reflectometry sensor or probe 100 in accordance with a second preferred embodiment of the invention. Probe 100 is functionally and structurally similar to probe 10 of FIGS. 1 and 2. The primary differences between probes 10 and 100 are with regard to the construction of the mounting and transition assembly.

Figure 3:
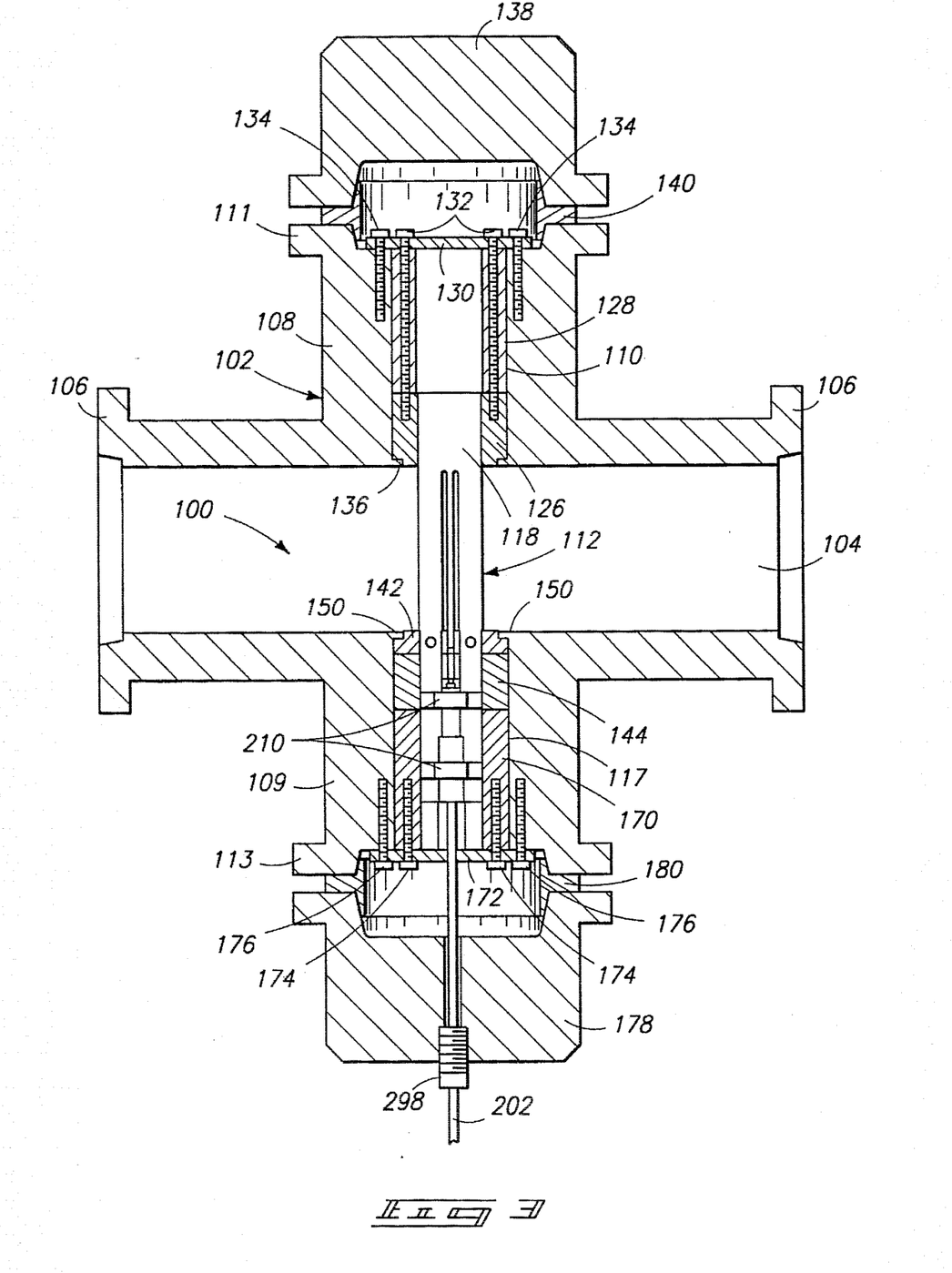
FIG. 3 is a sectional view showing the front of a time domain reflectometry sensor in accordance with a second preferred embodiment of the invention. The sensor is shown within a novel piping system sensor mount specifically adapted for supporting and sealing the sensor.

Probe 100 is intended to be positioned within a piping run or other fluid conduit. Specifically, probe 100 is mounted within an in-line cross adapter mount or fitting 102 (FIG. 3). Cross mount 102 has a cylindrical fluid conduit 104 which extends longitudinally between a pair of opposed end couplings 106. Cross mount 102 is for mounting between a pair of pipes to provide liquid communication therebetween.

Cross adapter 102 includes opposed distal-end and proximal end cross tubes 108 and 109, respectively, which extend outwardly from fluid conduit 104. As shown, cross tubes 108 and 109 have cylindrical internal openings 110 aligned with a central longitudinal probe axis defined by electrode 14. The internal openings define a probe mounting cavity. The probe axis intersects and is perpendicular to the longitudinal central axis of fluid conduit 104. Cross tubes 108 and 109 terminate at flanges 111 and 113, respectively.

Figure 5:
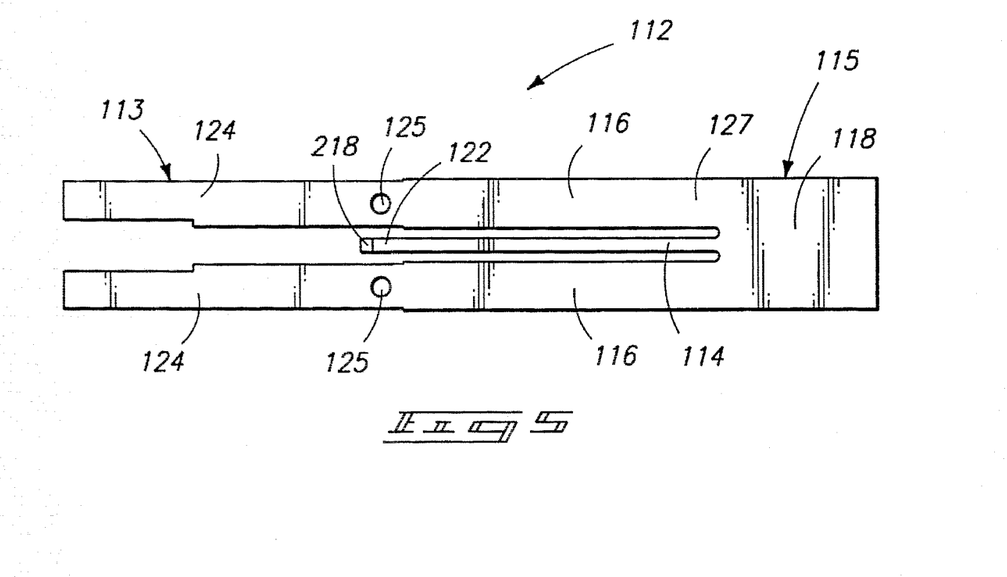
FIG. 5 is a frontal view of a sensor blade which forms part of the sensor shown in FIG. 3.

Probe 100 extends longitudinally within the probe mounting cavity through internal openings 110 of cross tubes 108 and 109. The probe spans fluid flow conduit 104 to present sensing surfaces of the probe to the flow within conduit 104. Probe 100 preferably has an elongated blade 112 for partial or full immersion in a fluid mixture of intermixed constituents flowing through fluid conduit 104. Blade 112 is formed in the shape of an elongated flat blade having a proximal end 113 and a distal end 115 (FIG. 5). The probe blade is oriented parallel to the probe axis mentioned above, and with its flat surfaces parallel to the direction of fluid flow. This mounting orientation reduces interference with and turbulence in the fluid stream flowing in conduit 104.

Probe blade 112 includes a central primary electrode 114 and outer or secondary electrodes 116 formed alongside and parallel with central electrode 114. The blade most preferably includes two outer electrodes 116 which are spaced equally and symmetrically about opposite sides of central electrode 114 to form a planar array and allow communication of fluids between the electrodes for sensing purposes. Each of the electrodes is elongated. The electrodes have distal portions or ends which terminate at the distal end of blade 112 in a distal end connection 118. Distal end connection 118 provides both a mechanical and electrical connection. The direct electrical connection causes the impedance to change at this point in the probe. The impedance change thus produces an effect which is detectable. The probe also produces an impedance change at the proximal end of the probe. With a reflected signal indicating when the time domain reflectometry signal reached the proximal and distal ends, it is possible to determine the probe transit time and associated permittivity of the fluid surrounding the electrodes. From this the system can be calibrated and used to determine various properties of the fluid stream within conduit 104, such as the relative proportions of intermixed fluid constituents having differing electrical permittivities.

Electrodes 114 and 116 are mechanically connected and extend from the distal connection 118 to proximal ends 122 and 124, respectively. The proximal ends of the electrodes are advantageously used as electrical connection points. Proximal ends 124 of outer electrodes 116 extend significantly beyond proximal end 122 of central electrode 114. A mounting hole 125 extends through each of outer electrodes 116 at an intermediate position along the lengths of outer electrodes 116.

Probe blade 112 is preferably fabricated so the electrodes are integrally connected such as cut from a single sheet of metal. The blade is advantageously made using corrosion-resistant materials such as already described with reference to FIGS. 1 and 2. The probe has sensing surfaces exposed to the fluid being detected similar to probe 10. The sensing surfaces are preferably treated or otherwise coated with one or more dielectric materials to form a dielectric layer 127. As discussed above, dielectric layer 127 covers at least the sensing surfaces of central electrode 114 and advantageously also covers at least portions of outer electrodes 116. More preferably, dielectric layer 127 covers all portions of blade 112 which are immersed in the fluid mixture, including central electrode 114 and outer electrodes 116. In the preferred embodiment shown, dielectric layer 127 is formed by an oxide coating which covers substantially all exterior surfaces of the blade and transition assembly. Portions of the oxide are removed as necessary for forming mechanical or electrical connections to the blade. The oxide coating is preferably formed by autoclaving Zircaloy as described above.

Probe blade 112 is supported at both distal and proximal ends within the opposed cross tubes 108 and 109. The supports are designed to also exclude intrusion of fluid to minimize any variations which might occur due to fluid changes other than against the sensing surfaces exposed between part 126 and part 142. Blade 112 is rigidly mounted at its proximal end within cross tube 109. Blade 112 is also supported within distal-end cross tube 108 in a mounting construction which allows longitudinal slippage of blade 112 to accommodate relative expansion and contraction.

More specifically, referring to FIG. 3, a distal-end slip support 126 is located within the distal-end cross tube 108. Distal-end slip support 126 has an aperture shaped to receive the distal connection 118 which serves to position the distal end of the probe relative to the distal end cross piece transverse extension 108. Distal end slip support 126 is advantageously a cylindrical insulator having a slotted receptacle formed therethrough for slidably receiving the distal end of blade 112. Slip support 126 is preferably fabricated from magnesia-stabilized zirconium oxide (zirconia). Alternatively, slip support 126 may be fabricated from alumina, Inconel, or Hastelloy. An annular distal-end support spacer 128, preferably made of the same material as slip support 126, is positioned behind slip support 126 within distal-end cross tube 108. Distal-end support spacer 128 has an internal diameter which is as least as great as the largest width dimension of blade 112, thereby allowing blade 112 to protrude beyond slip support 126 and within a central cavity defined inside the tubular support spacer 128, such as when thermal expansion occurs.

A distal-end retainer plate 130 is positioned outward from annular support spacer 128. Slip support 126, support spacer 128, and retainer plate 130 are connected together by a first set of bolts or screws 132. Bolts 132 serve as distal end assembly bolts forming a distal-end support assembly for supporting the distal end of blade 112 within distal-end cross tube 108. The assembly is mounted within the distal internal opening 110 by a second set of bolts or screws 134. Bolts 134 extend through retainer plate 130 and into the end of distal-end cross tube 108. A reduced-diameter flange is positioned about the internal opening of distal-end cross tube 108 at its intersection with fluid conduit 104 to retain the distal-end support assembly within distal-end internal opening 110. A distal-end cap 138 is positioned over cross tube 108 at its cross-tube coupling 111. A gland seal ring 140 is positioned to seal between distal-end cap 138 and the corresponding coupling flange 111. Fasteners (not shown) hold the caps to flanges 111 and 113.

Figure 6:
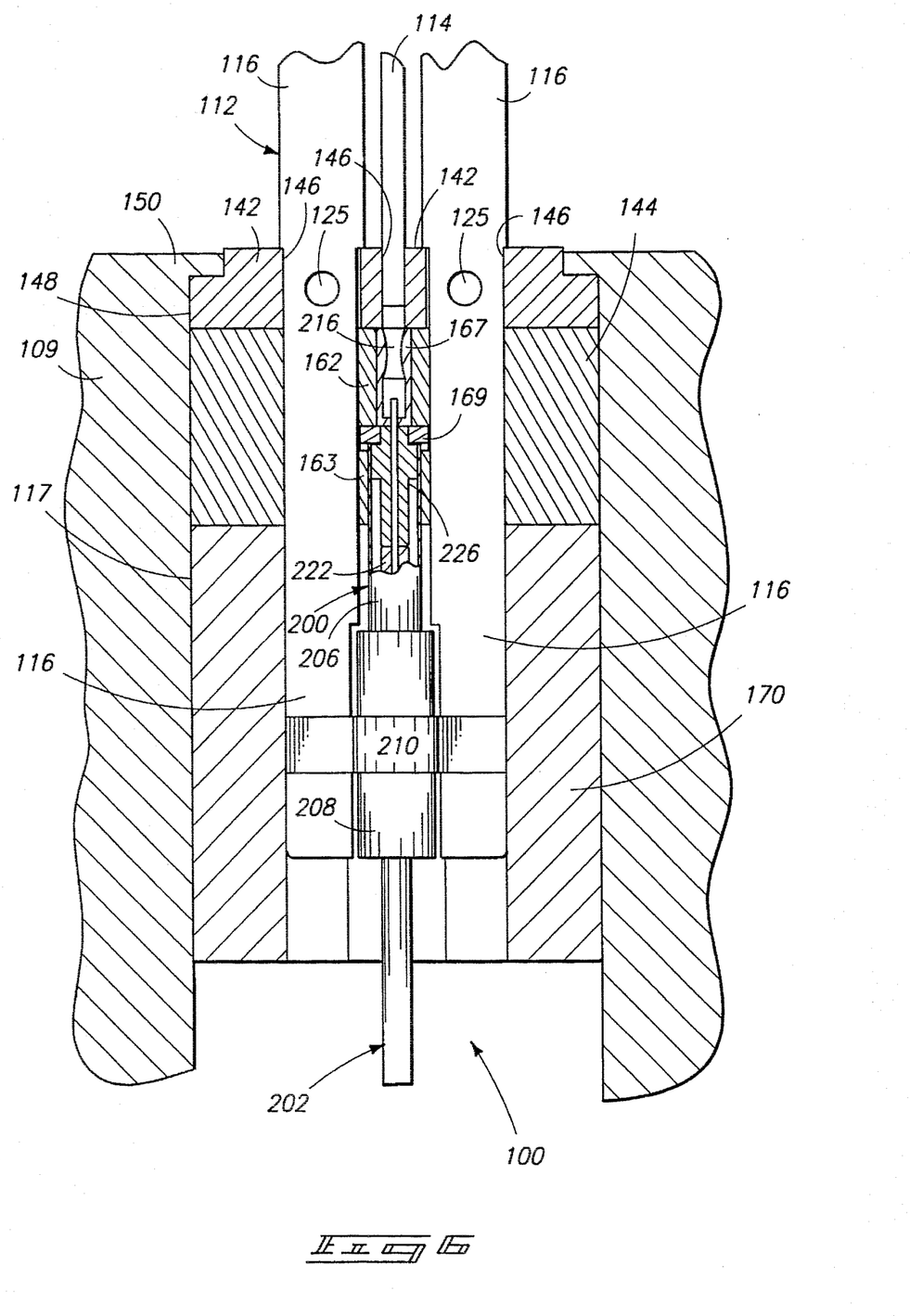
FIG. 6 is a view showing a portion of the sensor shown in FIG. 3 as mounted in adjacent components. Portions are shown in sectional presentation with some parts broken away.
Figure 8:
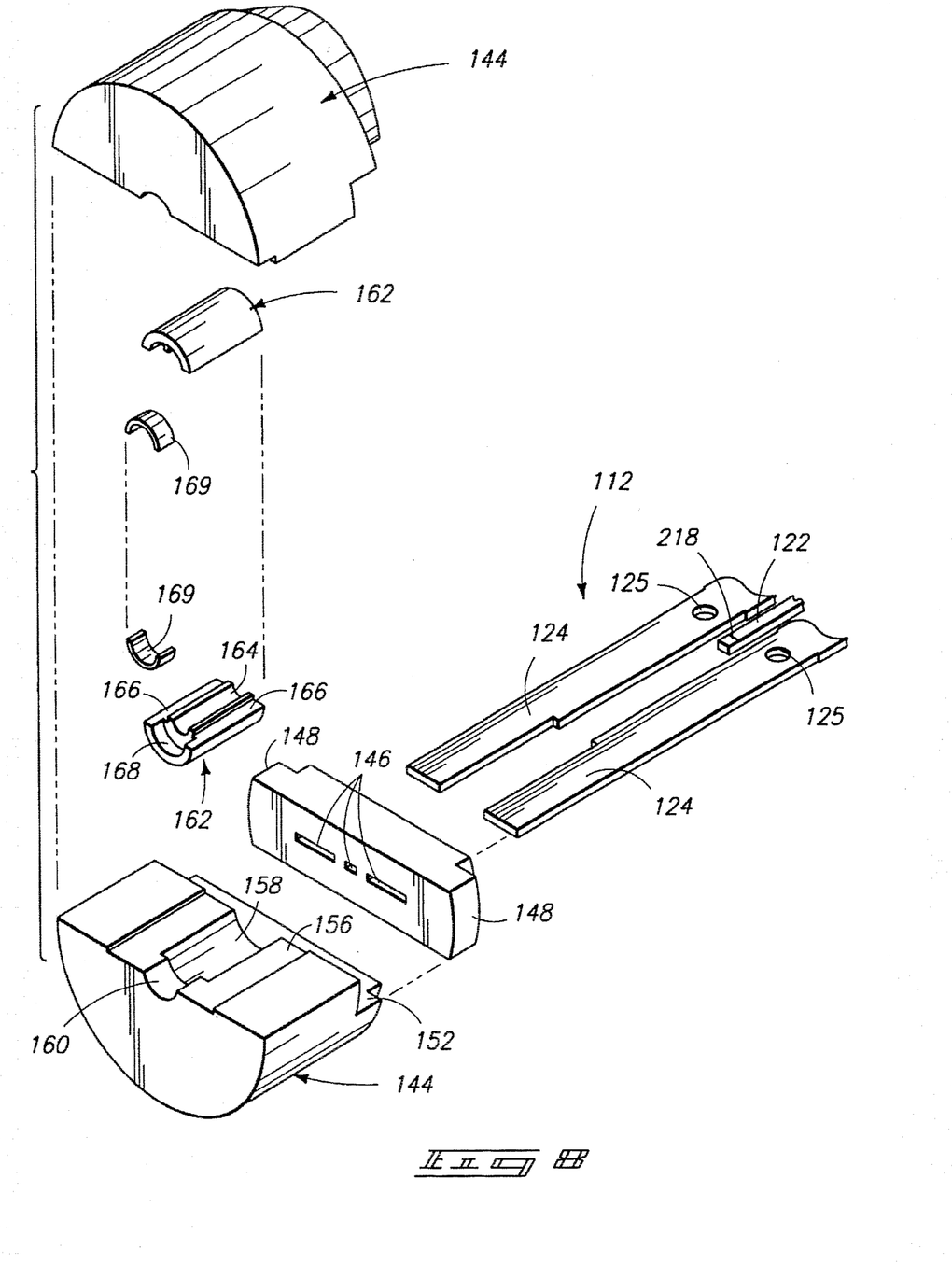
FIG. 8 is an exploded view showing mounting parts used in the sensor of FIG. 3.

The proximal end of blade 112 is securely mounted within proximal end cross tube 109. The mounting construction serves not only to fix the probe mounting location but also to exclude the fluid being conveyed in line 104 to the extent possible. Reference to FIGS. 3, 6 and 8, is helpful in connection with this description. To prevent longitudinal movement of blade 112 it is securely affixed to a weld block 142. This is accomplished by brazing proximal portions of blade 112 which are received within slots or openings 146 of the weld block. Slots 146 are complimentary in size to blade electrodes 114 and 116. More specifically, holes 125 in secondary electrodes 116 are filled with braze filler by capillary action to bond the blade to adjacent regions of weld block 142. Weld block 142 is advantageously a ceramic insulator such as magnesia-stabilized zirconium oxide or alumina. A variety of suitable brazing materials are used to join the electrodes and the weld block.

FIG. 8 shows that weld block 142 has shoulders 148 which engage a flange 150 (FIG. 3) formed about the internal opening of proximal end cross tube 109 at its intersection with fluid conduit 104. The shoulders 148 of the weld block prevent inward displacement of the probe assembly. Weld block 142 is forced against flange 150 by components described below to firmly anchor the proximal end of blade 112.

Weld block 142 is directed supported by a proximal end slip support spacer 144. Probe weld block 142 mates with proximal end slip support spacer 144 to provide resistance to both outward motion and twisting of the blade within the mount. This anti-rotational mounting function prevents misalignment of the blade within the fluid stream. FIG. 8 shows that proximal end slip support spacer 144 is preferably formed in mating halves, advantageously of stainless steel or Inconel. When mated, the halves form a receiving channel or cutout 152 which receives weld block 142. Support spacer 144 is received within proximal end cross tube 109. The support spacer has an outer diameter which is approximately complementary to the internal opening 117 of proximal end cross tube 109.

FIG. 8 shows the mating faces of support spacer 144 include recessed slot portions 156 which accommodate secondary electrodes 116. Support spacer 144 further includes a first cylindrical bore 158 and a second, smaller, cylindrical bore 160. A split inner support spool 162 fits within first cylindrical bore 158. Inner support spool 162 is formed of alumina. When its halves are mated, spool 162 forms an inner aperture 164 and outer slots 166 along each side. The slots 166 receive portions of the blade 112, and complement slot 156 formed by the mating halves of support spacer 144. Inner aperture 164 aligns to receive proximal portions of central electrode 114. Suitable packing 167 (FIG. 6), such as Teflon packing is used to fill aperture 164 about electrode 114.

Support spool 162 also has a counterbore 168 having an inner diameter approximately equal to that of second cylindrical bore 160 of slip support spacer 144. A split Teflon collar 169 (see FIG. 6) and split Teflon spacer 163 (shown only in FIG. 6) fits within counterbore 168 and second cylindrical bore 160.

FIG. 3 shows a rear support block 170 which fits outboard from support spacer 144 to press support spacer 144 and weld block 142 against flange 150. A proximal end retainer plate 172 is positioned outward of rear support block 170. Retainer plate 172 is connected to rear support block 170 by a set of proximate end assembly bolts or screws 174. Retainer plate 172 is in turn bolted to proximal end cross tube 109 by a fourth set of proximal end probe mounting bolts or screws 176. Bolts 176 extend through retainer plate 172 and into the end of cross tube 109.

Rear support block 170 has a partially hollow interior which includes a receptacle shaped to receive the various probe components described herein. The receptable forms shoulders 189 against which the proximal end surfaces of the blade rest. A proximal end cap 178 is positioned over cross tube 109 at its cross-tube coupling 113. A gland seal ring 180 is positioned to seal between proximal end cap 178 and the corresponding coupling flange 113. Cap 138 is mounted to flange 113 using suitable fasteners (not shown). A threaded signal lead support fitting 298 can be used to support the lead as it passes through cap 178.

Figure 4:
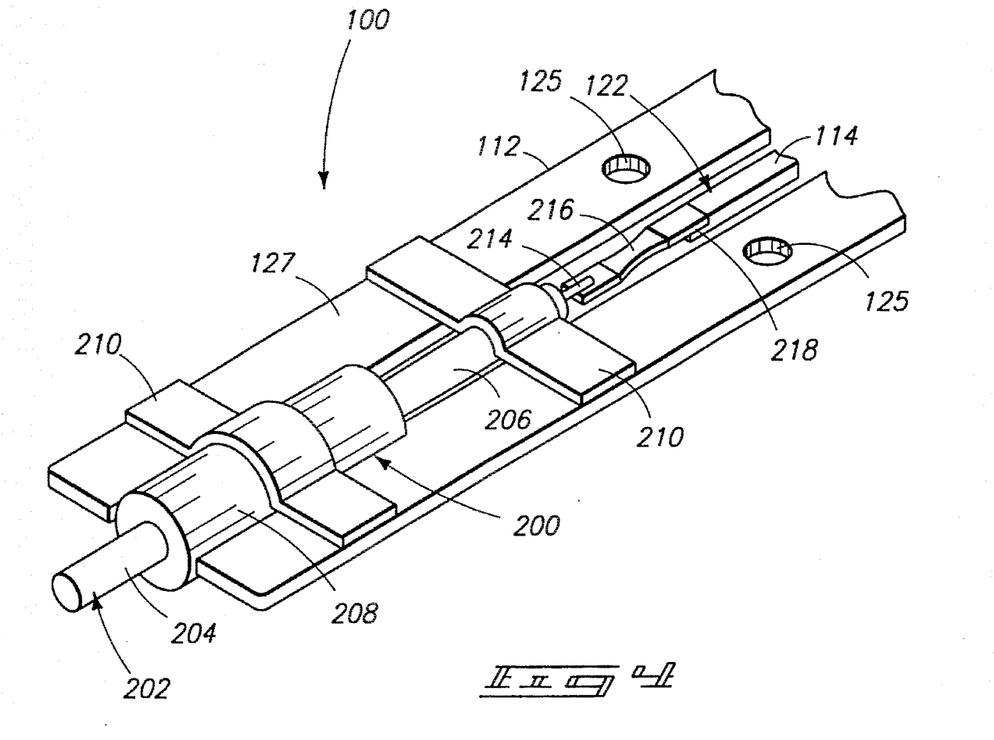
FIG. 4 is a perspective view of a portion of the sensor shown in FIG. 3.

FIG. 4 shows that probe 100 includes a transition assembly 200 positioned between a coaxial cable 202 and electrodes 116 and 114 to provide electrical connections between the coaxial cable conductors and the electrodes. Transition assembly 200 also serves to form a seal to prevent leakage through or about the coaxial cable 202 when the probe is mounted in a pressurized vessel, or conduit 104 as shown. Transition assembly 200 receives an end of coaxial cable 202 to seal said end from the fluid mixture within fluid conduit 104. The transition assembly includes a housing which is received over the cable's outer sheathing 204. The housing comprises a stainless steel cylindrical ferrule 206 and a stainless steel mating cap 208. The housing is mounted by a pair of brackets 210 which extend between and are connected to outer electrodes 116 of blade 112. The housing is supported and arranged to be coaxial with respect to the centrally positioned primary electrode 114. Brackets 210 are bonded to the housing by brazing or other suitable connection. The brackets are also bonded to the outer secondary electrodes 116 of blade 112 also by brazing, welding or other suitable bonding techniques. The housing and brackets establish electrical connections between the conductive outer sheathing 204 of the coaxial lead 202 and outer secondary electrodes 116 of blade 112.

Ferrule 206 is preferably cylindrical and has a diameter larger than the outer diameter of coaxial cable 202. Mating cap 208 is also preferably cylindrical, having an internal diameter complementary to the outer diameter of cable 202. It is brazed or welded to outer sheathing 204 of cable 202. Mating cap 208 is counterbored at one end to receive a portion of ferrule 206 therein. Ferrule 206 is brazed or welded within counterbore 209 of mating cap 208. The outer sheath 204 of the coaxial cable is also brazed or otherwise bonded to the bore of cap 208.

Outer sheathing 204 and the underlying coaxial cable insulating material are trimmed from the probe end of cable 202 so that only the central conductor 212 extends within ferrule 206. Central conductor 212 is connected to central probe electrode 114 by means of a central conductor extension or conductor pin 214 and a conductor adapter link 216. Conductor pin 214 is advantageously made of stainless steel.

Conductor adapter link 216 is a short length or tab of flat material, such as Inconel 625, having a thickness of from 0.006 to 0.010 inches. It extends from proximal end 122 of central electrode 114 to conductor pin 214 through inner aperture 164 of support spool 162. Inner aperture 164 is packed with Teflon packing 167 around adapter link 216. Proximal end 122 of central electrode 114 has a recess or notch 218 to receive adapter link 216 (FIGS. 4 and 5). One end of adapter link 216 is welded within notch 218. Conductor pin 214 is connected to the other end of adapter link 216 by first vacuum brazing conductor pin 214 to a flat weld pad (not shown) which is fabricated of a suitable material, such as Inconel 625 explosively bonded to Zircaloy. The weld pad is brazed to the Zircaloy electrode 114 and provides a surface to which the Inconel adapter link 216 can be affixed by welding. Similar bimetallic sandwich weld pads (not shown) are also preferably used to connected the brackets 210 with the blade 112 due to the difficulty in providing metallic bonding between steel alloys and Zircaloy using existing technology.

Figure 7:
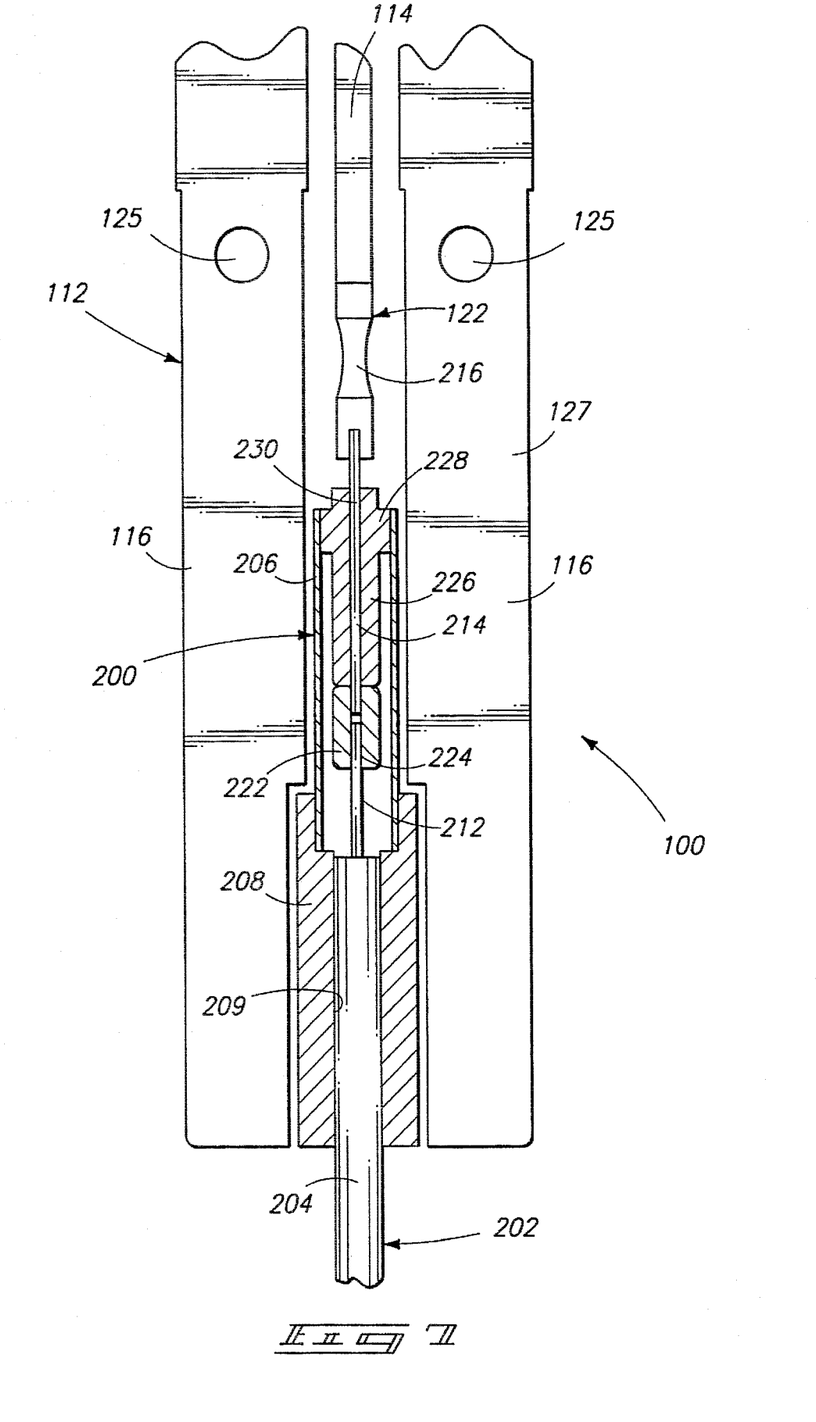
FIG. 7 is an enlarged view of a portion of the sensor blade shown in FIG. 3, including a sectional presentation of a transition assembly portion which forms part of the sensor shown in FIG. 3.

FIG. 7 shows that conductor pin 214 is electrically connected to central conductor 212 of cable 202 by means of connector tube 222 which provides a internal bore or conduit which is filled with conductive metallic brazing material to electrically and mechanically join these parts. Connector tube 222 is preferably formed of an electrically nonconducting ceramic such as an alumina ceramic. The outer diameter of connector tube 222 is preferably smaller than the internal diameter of ferrule 206. A conductor aperture 224 is formed through tube 222 to receive central cable conductor 212 and conductor pin 214. Cable conductor 212 and conductor pin 214 are joined, such as by vacuum brazing within conductor aperture 224.

Transition assembly 200 further includes a transition seal piece 226. Seal piece 226 is received within ferrule 206 and serves to electrically isolate the central conductors 212 and 214 from the ferrule 206. Seal piece 226 is bonded with the ferrule 206 and conductor 214 to form annular seals which prevent leakage of pressurized fluid through coaxial cable 202. Seal piece 226 has a diameter which is smaller than the internal diameter of ferrule 206, except for a sealing portion 228 which has an enlarged diameter complementary to the internal diameter of ferrule 206. Transition insulator 226 is fabricated from a ceramic material which is capable of being brazed to ferrule 206. Zirconium oxide, stabilized with magnesia, has been found to be the preferable material in high-pH environments. The zirconium oxide insulator is brazed to ferrule 206 about the periphery of sealing portion 228 with a copper-gold brazing alloy after first metalizing the surface of the sealing portion 228. Transition insulator 226 extends outward from ferrule 206 and within split Teflon collar 169.

Transition insulator 226 also has a conductor aperture 230 formed longitudinally therethrough. Conductor pin 214 is received through conductor aperture 230 and vacuum brazed therein with a suitable brazing material. The brazing material completes the dual annular seal arrangement between the fluid mixture and the end of cable 202.

Figure 9:
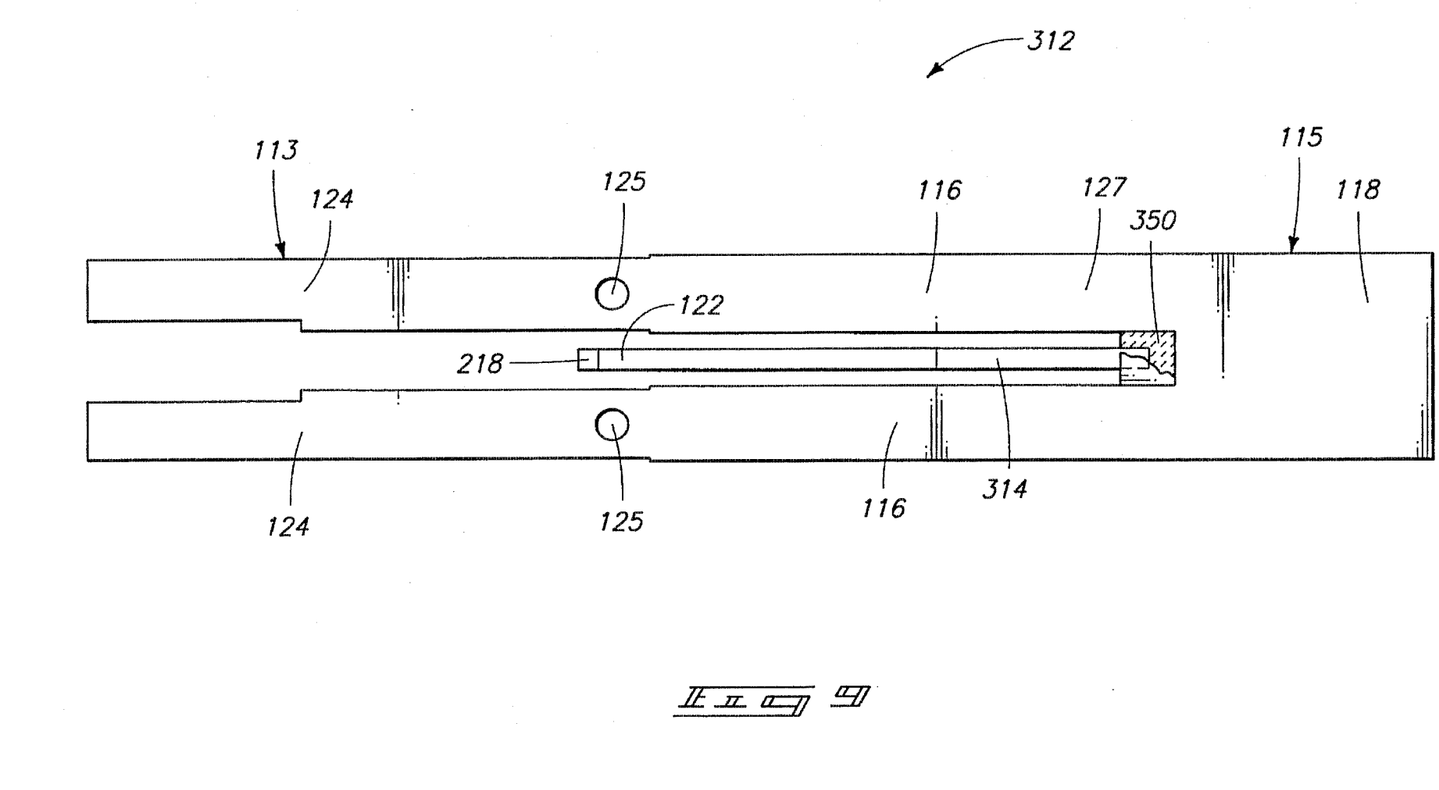
FIG. 9 is a frontal view of an alternative sensor blade which can be used in lieu of that shown in FIG. 5.

FIG. 9 shows an alternative form of probe blade 312 which is similar in almost all respects to probe blade 112 (see FIG. 5). Similar features of blade 312 have been numbered with the same reference numerals as used in the description given above in connection with probe blade 112. The differences between probe blade 312 and 112 will now be detailed.

In probe blade 312, the probe blade center conductor 314 is not electrically connected to the outer electrodes 116. Instead the center conductor 314 is electrically isolated from the outer electrodes. Center conductor 314 is preferably mechanically supported by the outer electrodes 116 and distal end piece 118 using an electrically insulatory support piece 350. Center electrode support piece 350 is advantageously provided with a receptacle into which the distal end of center electrode 314 is received and securely held. The outer portions of support piece 350 engage with the outer electrodes and distal end piece to provide good mechanical support to reduce vibration and mechanical wear or breakage which might occur to the center electrode when fluid dynamic forces bear upon the probe blade during extended service periods.

The invention is made using commercial known machining and manufacturing techniques to produce the components indicated. The components are assembled as explained hereinabove. The probe is then installed in the mounting cross 102 by arranging and assembling the components as indicated.

Once installed the lead cable 202 is connected to a time domain reflectometer as explained in the Mohr patent. The lead cable 202 is used to both convey the stimulating signal and to reconvey reflected signals which occur at the proximal and distal ends of the probe due to the impedance changes thereat. This provides information of the average transit time over the length of the probe. The average transit time information and its variation over time are used to indicate the relative proportions of intermixed constituents and the degree of turbulence. Other properties may also be derivable from the measured information.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

I claim:

1. A sensor for use with time domain reflectometry systems to allow measurement of a fluid mixture having intermixed constituents with differing electrical permittivities, comprising:

at least one primary electrode made from electrically conductive material; said at least one primary electrode having sensing surfaces adjacent to which the fluid mixture is located during sensing; said primary electrode being for conducting a pulsed time domain reflectometry signal along the length thereof;

at least one secondary electrode having a spaced relationship with said at least one primary electrode to allow the fluid mixture to be present between the at least one primary electrode and the at least one secondary electrode; said at least one secondary electrode being made from electrically conductive material;

a dielectric layer covering at least said sensing surfaces of said at least one primary electrode, to electrically isolate the primary electrode from the fluid mixture and prevent dissipation of a time domain reflectometry signal propagated through said sensor, said dielectric layer having a thickness of from about 1 thousandths of an inch to about 10 thousandths of an inch.

2. A sensor according to claim 1 wherein there are two secondary electrodes arranged along opposing sides of the primary electrode.

3. A sensor according to claim 1 wherein the primary and secondary electrodes are elongated and formed in spaced parallel relationship.

4. A sensor according to claim 1 wherein the primary and secondary electrodes are in an electrically isolated relationship.

5. A sensor according to claim 1 wherein the dielectric layer is an oxide layer formed upon said at least said sensing surfaces of said at least one primary electrode.

6. A sensor according to claim 1 wherein the dielectric layer includes zirconium.

7. A sensor according to claim 1 wherein the dielectric layer includes zirconia.

8. A sensor according to claim 1 wherein the dielectric layer is an oxide coating.

9. A sensor according to claim 1 wherein the dielectric layer is a polytetrafluoroethylene coating.

10. A sensor according to claim 1 wherein the dielectric layer has a thickness of from about 1 thousandths of an inch to about 10 thousandths of an inch.

11. A sensor according to claim 1 wherein the dielectric layer has a thickness of from about 2 thousandths of an inch to about 5 thousandths of an inch.

12. A sensor according to claim 1 wherein the primary and secondary electrodes have distal portions which are electrically connected to each other.

13. A sensor according to claim 1 wherein the dielectric layer covers portions of the secondary electrode to electrically isolate the secondary electrode from the fluid mixture and to further prevent dissipation of a time domain reflectometry signal.

14. A sensor according to claim 1 wherein the primary and secondary electrodes include an elongated blade.

15. A sensor according to claim 1 and further comprising at least two of the secondary electrodes, the secondary electrodes being spaced symmetrically about said at least one primary electrode.

16. A sensor according to claim 1 and further comprising a transition assembly providing electrical connections with the primary and secondary electrodes and providing a seal to aid in preventing fluid leakage from the sensor.

17. A sensor according to claim 1 and further comprising:

a coaxial electrical signal cable having a central conductor which is electrically connected to the primary electrode;

a transition assembly providing electrical connections between the primary and secondary electrodes and providing at least one seal to aid in preventing fluid leakage from the sensor.

18. A sensor according to claim 1 and further comprising:

a coaxial electrical signal cable having a central conductor;

a conductor pin which extends between the central conductor and the at least one primary electrode to provide electrical connection therebetween;

a transition assembly positioned between the coaxial electrical signal cable and the primary electrode, the transition assembly including a transition insulator, the conductor pin being sealingly received through the transition insulator to seal the coaxial electrical signal cable from the fluid mixture.

19. A sensor according to claim 1 and further comprising:

a coaxial electrical signal cable having an outer conductor and a central conductor;

a transition assembly positioned between the coaxial electrical signal cable and the primary electrode;

the transition assembly including a housing which is sealingly received over the outer conductor of the coaxial electrical signal cable;

the transition assembly including a conductor pin which extends between the central conductor of the electrical signal cable and the at least one primary electrode to provide electrical connection therebetween;

the transition assembly further including a transition insulator which is sealingly received within the transition assembly housing, the conductor pin being sealingly received through the transition insulator to seal the coaxial electrical signal cable from the fluid mixture.

20. A sensor for use with time domain reflectometry systems to allow measurement of a fluid mixture having intermixed constituents with differing electrical permittivities, comprising:

at least one primary electrode made from electrically conductive material; said at least one primary electrode having sensing surfaces adjacent to which the fluid mixture is located during sensing; said primary electrode being for conducting a pulsed time domain reflectometry signal along the length thereof;

at least one secondary electrode having a spaced relationship with said at least one primary electrode to allow the fluid mixture to be present between the at least one primary electrode and the at least one secondary electrode; said at least one secondary electrode being made from electrically conductive material;

said at least one primary electrode being centrally located between at least two secondary electrodes symmetrically arranged along opposing sides of the primary electrode to provide an approximately planar electrode array;

a dielectric layer covering at least said sensing surfaces of said at least one primary electrode, to electrically isolate the primary electrode from the fluid mixture and prevent dissipation of a time domain reflectometry signal propagated through said sensor, said dielectric layer having a thickness of from about 1 thousandths of an inch to about 10 thousandths of an inch.

21. A sensor according to claim 20 wherein the primary and secondary electrodes are elongated and formed in spaced parallel relationship.

22. A sensor according to claim 20 wherein the primary and secondary electrodes are in an electrically isolated relationship.

23. A sensor according to claim 20 wherein the dielectric layer is an oxide layer formed upon said at least said sensing surfaces of said at least one primary electrode.

24. A sensor according to claim 20 wherein the dielectric layer includes zirconium.

25. A sensor according to claim 20 wherein the dielectric layer includes zirconia.

26. A sensor according to claim 20 wherein the dielectric layer is an oxide coating.

27. A sensor according to claim 20 wherein the dielectric layer is a polytetrafluoroethylene coating.

28. A sensor according to claim 20 wherein the dielectric layer has a thickness of from about 1 thousandths of an inch to about 10 thousandths of an inch.

29. A sensor according to claim 20 wherein the dielectric layer has a thickness of from about 2 thousandths of an inch to about 5 thousandths of an inch.

30. A sensor according to claim 20 wherein the primary and secondary electrodes have distal portions which are electrically connected to each other.

31. A sensor according to claim 20 wherein the dielectric layer covers portions of the secondary electrode to electrically isolate the secondary electrode from the fluid mixture and to further prevent dissipation of a time domain reflectometry signal.

32. A sensor according to claim 20 wherein the primary and secondary electrodes include an elongated blade.

33. A sensor according to claim 20 and further comprising a transition assembly providing electrical connections with the primary and secondary electrodes and providing a seal to aid in preventing fluid leakage from the sensor.

34. A sensor according to claim 20 and further comprising:

a coaxial electrical signal cable having a central conductor which is electrically connected to the primary electrode;

a transition assembly providing electrical connections between the primary and secondary electrodes and providing at least one seal to aid in preventing fluid leakage from the sensor.

35. A sensor according to claim 20 and further comprising:

a coaxial electrical signal cable having a central conductor;

a conductor pin which extends between the central conductor and the at least one primary electrode to provide electrical connection therebetween;

a transition assembly positioned between the coaxial electrical signal cable and the primary electrode, the transition assembly including a transition insulator, the conductor pin being sealingly received through the transition insulator to seal the coaxial electrical signal cable from the fluid mixture.

36. A sensor according to claim 20 and further comprising:

a coaxial electrical signal cable having an outer conductor and a central conductor;

a transition assembly positioned between the coaxial electrical signal cable and the primary electrode;

the transition assembly including a housing which is sealingly received over the outer conductor of the coaxial electrical signal cable;

the transition assembly including a conductor pin which extends between the central conductor of the electrical signal cable and the at least one primary electrode to provide electrical connection therebetween;

the transition assembly further including a transition insulator which is sealingly received within the transition assembly housing, the conductor pin being sealingly received through the transition insulator to seal the coaxial electrical signal cable from the fluid mixture.

37. A sensor for use with time domain reflectometry systems to allow measurement of a fluid mixture having intermixed constituents with differing electrical permittivities, comprising:

at least one primary electrode made from electrically conductive material; said at least one primary electrode having sensing surfaces adjacent to which the fluid mixture is located during sensing; said primary electrode being for conducting a pulsed time domain reflectometry signal along the length thereof;

at least one secondary electrode having a spaced relationship with said at least one primary electrode to allow the fluid mixture to be present between the at least one primary electrode and the at least one secondary electrode; said at least one secondary electrode being made from electrically conductive material;

said at least one primary electrode being centrally located between at least two secondary electrodes symmetrically arranged along opposing sides of the primary electrode to provide an approximately planar electrode array;

a dielectric layer covering at least said sensing surfaces of said at least one primary electrode, to electrically isolate the primary electrode from the fluid mixture and prevent dissipation of a time domain reflectometry signal progated through said sensor, said dielectric layer having a thickness of from about 1 thousandths of an inch to about 10 thousandths of an inch.

38. A sensor according to claim 37 wherein the primary and secondary electrodes are elongated and formed in spaced parallel relationship.

39. A sensor according to claim 37 wherein the primary and secondary electrodes have distal portions which are electrically connected to each other.

40. A sensor according to claim 37 wherein the primary and secondary electrodes are electrically isolated from each other.

41. A sensor according to claim 37 wherein the primary and secondary electrodes include an elongated blade.

42. A sensor according to claim 37 and further comprising a transition assembly providing electrical connections with the primary and secondary electrodes and providing at least one seal to aid in preventing fluid leakage from the sensor.

43. A sensor according to claim 37 and further comprising:

a coaxial electrical signal cable having a central conductor which is electrically connected to the primary electrode;

a transition assembly providing electrical connections between the primary and secondary electrodes and providing a seal to aid in preventing fluid leakage from the sensor.

44. A sensor according to claim 37 and further comprising:

a coaxial electrical signal cable having a central conductor;

a conductor pin which extends between the central conductor and the at least one primary electrode to provide electrical connection therebetween;

a transition assembly positioned between the coaxial electrical signal cable and the primary electrode, the transition assembly including a transition insulator, the conductor pin being sealingly received through the transition insulator to seal the coaxial electrical signal cable from the fluid mixture.

45. A sensor according to claim 37 and further comprising:

a coaxial electrical signal cable having an outer conductor and a central conductor;

a transition assembly positioned between the coaxial electrical signal cable and the primary electrode;

the transition assembly including a housing which is sealingly received over the outer conductor of the coaxial electrical signal cable;

the transition assembly including a conductor pin which extends between the central conductor of the electrical signal cable and the at least one primary electrode to provide electrical connection therebetween;

the transition assembly further including a transition insulator which is sealingly received within the transition assembly housing, the conductor pin being sealingly received through the transition insulator to seal the coaxial electrical signal cable from the fluid mixture.

* * * * *